(12) United States Patent
Lee et al.

(10) Patent No.: US 9,455,009 B2
(45) Date of Patent: Sep. 27, 2016

(54) OPERATING CHARACTERISTICS OF A SEMICONDUCTOR DEVICE

(71) Applicant: SK hynix Inc., Icheon-si Gyeonggi-do (KR)

(72) Inventors: Yeonghun Lee, Seongnam-si (KR); Dong Hwan Lee, Yongin-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 14/616,996

(22) Filed: Feb. 9, 2015

(65) Prior Publication Data

US 2016/0078942 A1    Mar. 17, 2016

(30) Foreign Application Priority Data

Sep. 15, 2014 (KR) .................. 10-2014-0122272

(51) Int. Cl.
*G11C 8/12* (2006.01)
*G11C 16/16* (2006.01)
*G11C 16/04* (2006.01)
*G11C 16/08* (2006.01)
*G11C 16/30* (2006.01)

(52) U.S. Cl.
CPC ............. *G11C 8/12* (2013.01); *G11C 16/0483* (2013.01); *G11C 16/08* (2013.01); *G11C 16/16* (2013.01); *G11C 16/30* (2013.01)

(58) Field of Classification Search
CPC ... G11C 16/0483; G11C 16/08; G11C 16/16; G11C 16/06; G11C 8/12; G11C 16/30; H01L 27/11578; H01L 27/11582; H01L 29/792
See application file for complete search history.

(56) References Cited

U.S. PATENT DOCUMENTS

| 6,961,268 | B2* | 11/2005 | Umezawa | G11C 16/08 |
| | | | | 365/185.01 |
| 7,075,826 | B2* | 7/2006 | Lee | H01L 27/11524 |
| | | | | 257/E27.103 |
| 7,245,533 | B2* | 7/2007 | Shibata | G11C 16/24 |
| | | | | 365/185.17 |
| 7,663,919 | B2* | 2/2010 | Shibata | G11C 11/5628 |
| | | | | 365/185.11 |
| 7,839,691 | B2* | 11/2010 | Chae | G11C 8/08 |
| | | | | 365/185.18 |
| 7,978,517 | B2* | 7/2011 | Isobe | G11C 8/08 |
| | | | | 365/185.11 |
| 8,077,525 | B2* | 12/2011 | Nakamura | G11C 16/0483 |
| | | | | 365/185.18 |
| 8,120,959 | B2* | 2/2012 | Lee | G11C 8/12 |
| | | | | 365/185.13 |
| 8,189,391 | B2* | 5/2012 | Itagaki | G11C 16/0483 |
| | | | | 365/185.17 |
| 8,203,882 | B2* | 6/2012 | Hishida | G11C 16/0483 |
| | | | | 365/185.17 |
| 8,369,158 | B2* | 2/2013 | Goda | G11C 16/16 |
| | | | | 365/185.29 |
| 8,487,383 | B2* | 7/2013 | Park | G11C 16/0483 |
| | | | | 257/339 |
| 8,830,751 | B2* | 9/2014 | Maejima | H01L 27/088 |
| | | | | 365/185.03 |
| 9,007,834 | B2* | 4/2015 | Rhie | G11C 11/5635 |
| | | | | 365/185.11 |
| 9,129,688 | B2* | 9/2015 | Isobe | G11C 16/0483 |
| 2005/0265109 | A1* | 12/2005 | Goda | G11C 8/10 |
| | | | | 365/230.06 |
| 2006/0083062 | A1* | 4/2006 | Park | G11C 16/30 |
| | | | | 365/185.11 |

FOREIGN PATENT DOCUMENTS

KR    1020120037187 A    4/2012

* cited by examiner

*Primary Examiner* — Vanthu Nguyen
(74) *Attorney, Agent, or Firm* — William Park & Associates Ltd.

(57) ABSTRACT

Provided is a semiconductor device. The semiconductor device includes memory blocks including select transistors electrically coupled to local select lines and memory cells electrically coupled to local word lines, a first connection circuit configured to electrically couple the local select lines of a selected memory block and global select lines according to a block select signal, and formed in a first well region of a substrate, and a second connection circuit configured to electrically couple the local word lines of the selected memory block and global word lines according to the block selection signal, and formed in a second well region of the substrate.

14 Claims, 9 Drawing Sheets

OPERATING CHARACTERISTICS OF A SEMICONDUCTOR DEVICE

CROSS-REFERENCE TO RELATED APPLICATION

The present application claims priority to Korean patent application number 10-2014-0122272 filed on Sep. 15, 2014, in the Korean Intellectual Property Office, the entire disclosure of which is incorporated by reference herein.

BACKGROUND

1. Technical Field

The invention relates to a semiconductor device. More specifically, the invention relates to a semiconductor device including a memory block.

2. Related Art

An operating voltage is needed to store data in memory cells included in a memory block. Specifically, in the case of a flash memory device, operating voltages are applied to select lines and word lines in order to store data in the memory cells.

Connection circuits are needed to transfer operating voltages to a selected memory block among a plurality of memory blocks. A portion of the connection circuits may transfer a negative voltage to improve characteristics of a program operation for storing data. In this case, a change of structures of the connection circuits is needed to improve transfer characteristics of the negative voltage.

SUMMARY

One aspect of the invention provides a semiconductor device that includes memory blocks including select transistors electrically coupled to local select lines and memory cells electrically coupled to local word lines. The semiconductor device also includes a first connection circuit configured to electrically couple the local select lines of a selected memory block and global select lines according to a block select signal, and formed in a first well region of a substrate. The semiconductor device also includes a second connection circuit configured to electrically couple the local word lines of the selected memory block and global word lines according to the block selection signal, and formed in a second well region of the substrate.

An aspect of the invention provides a semiconductor device, including a first connection circuit formed in a first well region of a substrate to electrically couple local select lines of a selected memory block to global select lines. The semiconductor device also includes a second connection circuit formed in a second well region of the substrate to electrically couple local word lines of the selected memory block to global word lines. Further, the first well region is isolated from the second well region.

In an embodiment of the invention, the semiconductor device includes a first connection circuit configured with first transistors to electrically couple select lines of a memory block to global select lines according to a block selection signal in a first well region. The semiconductor device also includes a second connection circuit configured with second transistors to electrically couple local word lines of the memory block to global word lines according to the block selection signal in a second well region.

DETAILED DESCRIPTION

The invention will be described more fully hereinafter with reference to the accompanying figures, in which various embodiments of the invention are shown. This invention may, however, be embodied in different forms and should not be construed as limited to the embodiments set forth. Various embodiments of the invention are described below in sufficient detail to enable those of ordinary skill in the art to embody and practice the invention. Further, it should be understood that the scope of the invention is defined by the claims. The invention is directed to providing a semiconductor device capable of improving operating characteristics.

Figure 1:
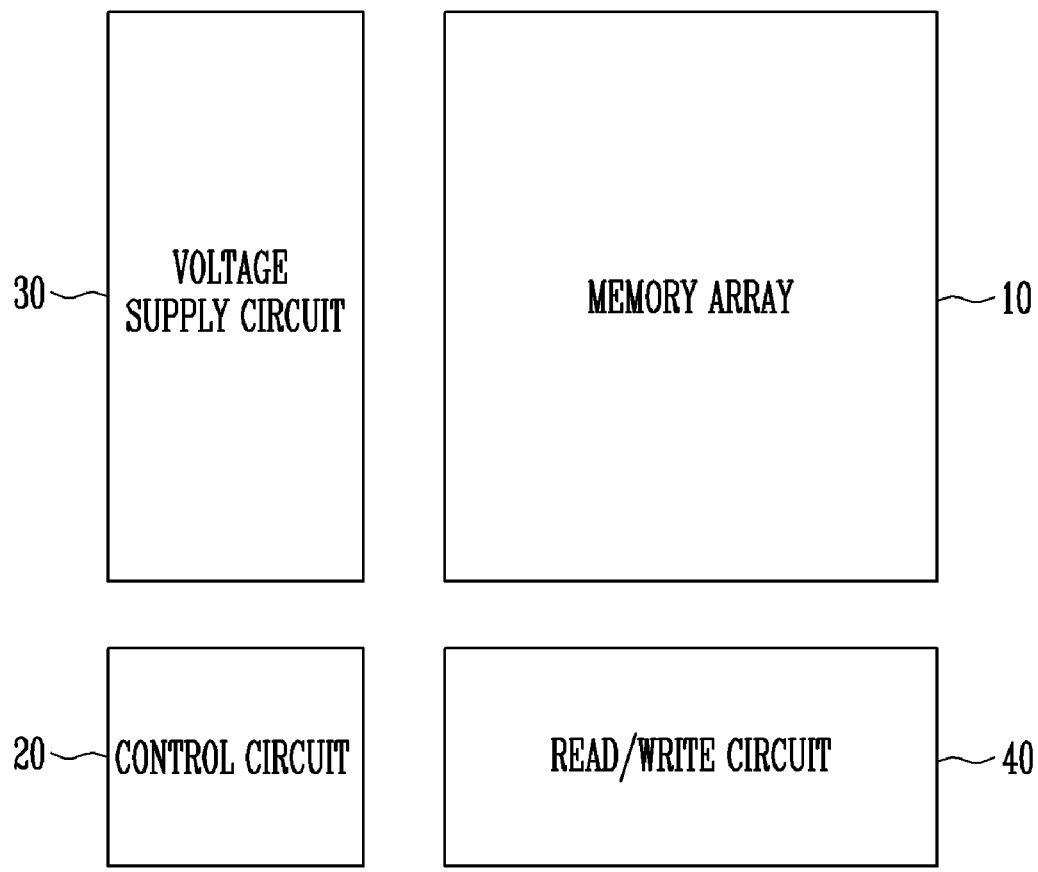
FIG. 1 is a block diagram for describing a semiconductor device according to an embodiment of the invention.

Referring to FIG. 1, a block diagram for describing a semiconductor device according to an embodiment of the invention is shown.

In FIG. 1, a semiconductor device may include a memory array 10, and operation circuits 20 to 40. The memory array 10 may include a plurality of memory blocks. Each memory block may include a plurality of memory strings. Each memory string may include a plurality of memory cells. When the semiconductor device 10 is a flash memory device, the memory block may include a flash memory cell. For example, the memory block may include flash memory cells including a floating gate formed of polysilicon, and a charge storage film of a nitride film.

More specifically, the memory block may include memory strings electrically coupled to bit lines, respectively, and are electrically coupled to a common source line in parallel. The memory strings may be formed to have a two-dimensional structure or a three-dimensional structure on a semiconductor substrate. The memory block including the memory strings having the three-dimensional structure will be described in detail below.

Figure 2A:
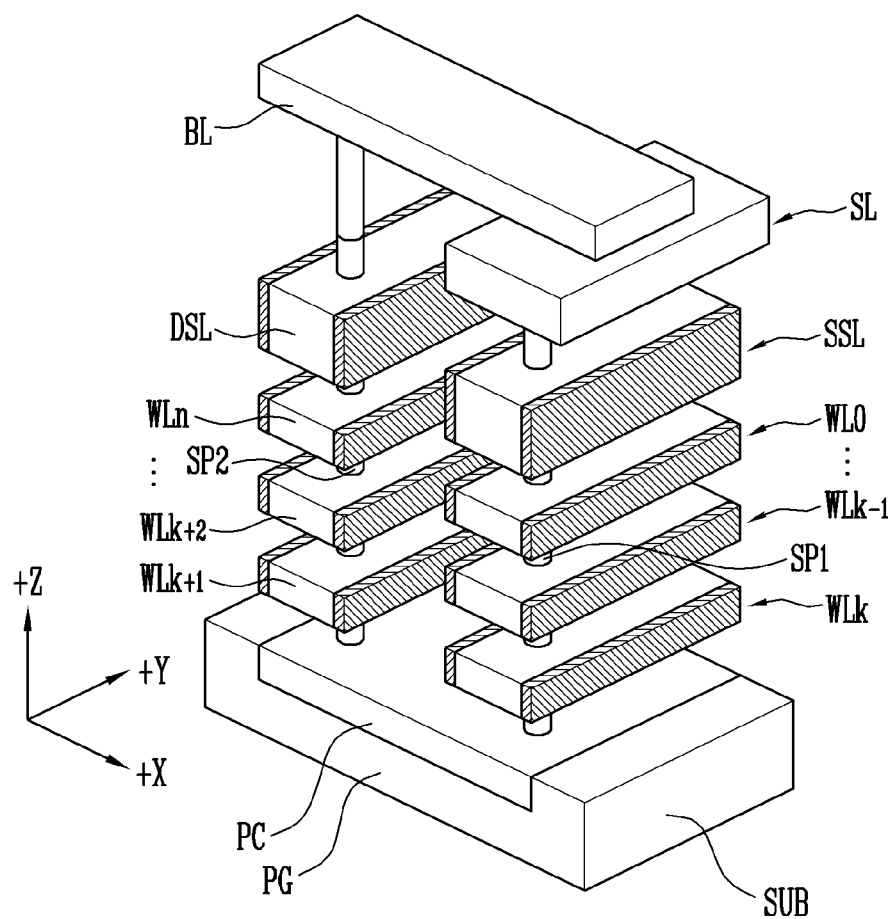
FIGS. 2A to 2C are diagrams for describing a memory block of FIG. 1.
Figure 2B:
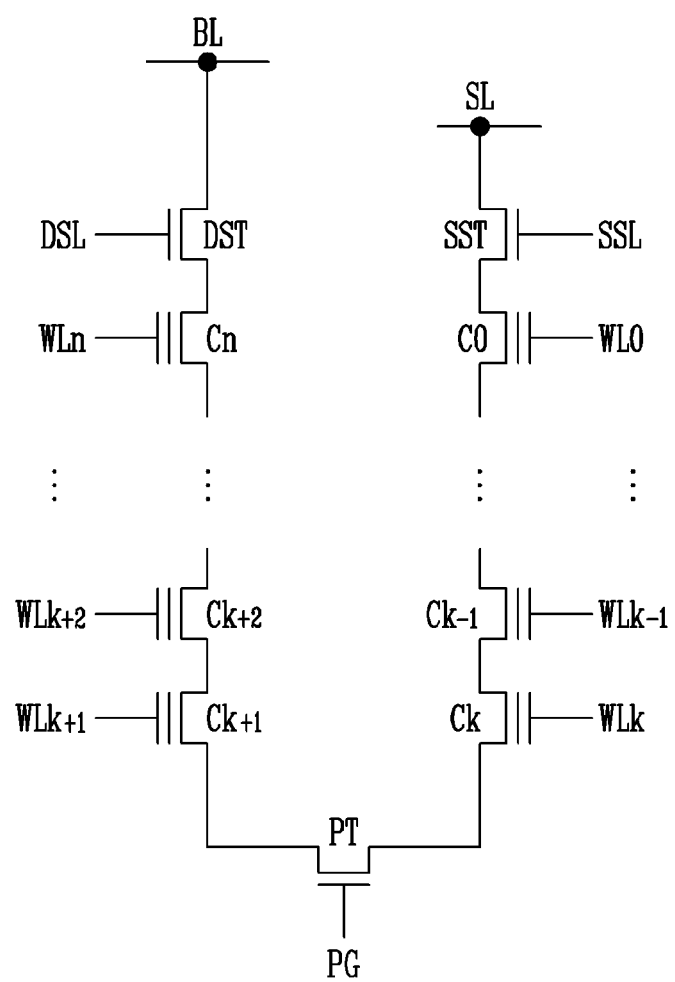
Figure 2C:
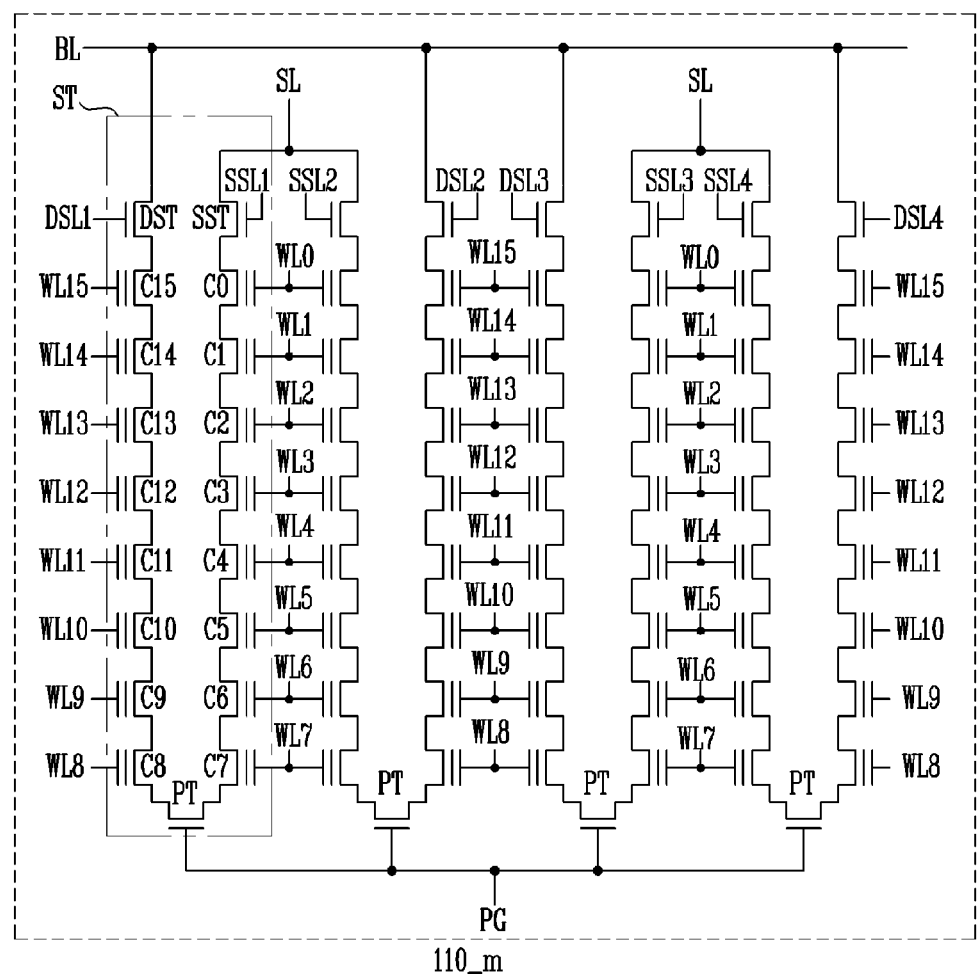

Referring to FIGS. 2A to 2C, diagrams for describing a memory block of FIG. 1 are described.

In FIGS. 2A and 2B, a pipe gate PG including a recessed portion may be formed on the semiconductor substrate SUB. In addition, a pipe channel layer PC may be formed in the recessed portion of the pipe gate PG. A plurality of vertical channel layers SP1 and SP2 may be formed on the pipe channel layer PC. An upper portion of a first vertical channel layer SP1 of a pair of the vertical channel layers SP1 and SP2 may be electrically coupled to a common source line SL. Further, an upper portion of a second vertical channel layers SP2 may be electrically coupled to a bit lint BL. The vertical channel layers SP1 and SP2 may be formed of polysilicon.

A plurality of conductive films DSL, and WLn to WLk+1 may be formed to surround the second vertical channel layer SP2 at different heights of the second vertical channel layer SP2. Further, a plurality of conductive films SSL, and WL0 to WLk may be formed to surround the first vertical channel layer SP1 at different heights of the first vertical channel layer SP1. A multi-layered film including a charge storage film may be formed on surfaces of the vertical channel layers SP1 and SP2 and a surface of the pipe channel layer PC. In addition, the multi-layered film may be located between the vertical channel layers SP1 and SP2 and the conductive films DSL, WLn to WLk+1, SSL, and WL0 to WLk, and between the pipe channel layer PC and the pipe gate PC.

The uppermost conductive film surrounding the second vertical channel layer SP2 may be a drain select line DSL. In addition, lower conductive films of the drain select line DSL may be the word lines WLn to WLk+1. The uppermost conductive film surrounding the first vertical channel layer SP1 may be a source select line SSL. Further, lower conductive films of the source select line SSL may be the word lines WL0 to WLk. A portion of the conductive films used as the word lines may be a dummy word line.

In other words, first conductive films SSL and WL0 to WLk and second conductive films DSL and WLn to WLk+1 may be stacked on different regions, respectively, of the semiconductor substrate SUB. The first vertical channel layer SP1 penetrating through the first conductive films SSL and WL0 to WLk may be vertically connected between the common source line SL and the pipe channel layer PC. The second vertical channel layer SP2 penetrating through the second conductive films DSL and WLn to WLk+1 may be vertically connected between the bit line BL and the pipe channel layer PC.

A drain select transistor DST may be formed at a portion in which the drain select line DSL surrounds the second vertical channel layer SP2. Further, main cell transistors Cn to Ck+1 may be formed at portions in which the word lines WLn to WLk+1 surround the second vertical channel layer SP2. A source select transistor SST may be formed at a portion in which the source select line SSL surrounds the first vertical channel layer SP1. In addition, main cell transistors C0 to Ck may be formed at portions in which the word lines WL0 to WLk surround the first vertical channel layer SP1.

By the above structure, the memory string may include the drain select transistor DST and the main cell transistors Cn to Ck+1 which are electrically coupled between the bit line BL and the pipe channel layer PC and are vertically connected to the substrate SUB. Further, the source select transistor SST and the main cell transistors C0 to Ck which are electrically coupled between the common source line SL and the pipe channel layer PC and are vertically connected to the substrate SUB. In the above structure, the dummy cell transistor may be further electrically coupled between the select transistor DST or SST and the main cell transistors Cn or C0. In addition, the dummy cell transistor may be further electrically coupled between the main cell transistor Ck+1 or Ck and the pipe transistor PT.

The source select transistor SST and the main cell transistors C0 to Ck electrically coupled between the common source line SL and the pipe transistor PT may constitute the first vertical memory string. Further, the drain select transistor DST and the main cell transistors Cn to Ck+1 electrically coupled between the bit line BL and the pipe transistor PT may constitute the second vertical memory string.

In FIG. 2C, the memory block 110_m may include the plurality of strings ST electrically coupled to the bit lines. In a P-BiCS structure, each memory string ST may include a first vertical memory strings SST and C0 to C7 vertically connected between the common source line SL and the pipe transistor PT of the substrate SUB. In addition, each memory string ST may include a second vertical memory strings C8 to C15 and DST vertically connected between the bit line BL and the pipe transistor PT of the substrate SUB. The first vertical memory strings SST and C0 to C7 may include the source select transistor SST and the memory cells C0 to C7. The source select transistor SST may be controlled by a voltage applied to a source select line SSL1. In addition, the memory cells C0 to C7 may be controlled by voltages applied to the stacked word lines WL0 to WL7. The second memory strings C8 to C15 may include the drain select transistor DST and the memory cells C8 to C15. The drain select transistor DST may be controlled by a voltage applied to a drain select line DSL1. In addition, the memory cells C8 to c15 may be controlled by voltages applied to the stacked word lines WL8 to WL15. FIG. 2C also illustrates source select lines SSL2 to SSL4 and drain select lines DSL2 to DSL4.

In the P-BiCS structure, the pipe transistor PT electrically coupled between a pair of memory cells C7 and C8 which locate in the middle of the memory string may perform an operation of electrically coupling the channel layers of the first vertical memory strings SST and C0 to C7 and the channel layers of the second vertical memory strings C8 to C15 and DST included in a selected memory block 110_m when the memory block 110_m is selected.

In the memory block having the two-dimensional structure, one memory string may be electrically coupled to each bit line. Further, the drain select transistors of the memory block are simultaneously controlled by one drain select line, but in the memory block having the three-dimensional structure, the plurality of memory strings ST may be commonly electrically coupled to each bit line BL. In the same memory block 110_m, the number of memory strings electrically coupled to one bit line BL and are controlled by the same word lines may be changed according to a design.

As the plurality of memory strings are electrically coupled to one bit line BL in parallel, the drain select transistors DST may be independently controlled by select voltages applied to the drain select lines DSL1 to DSL4 to electrically couple one bit line BL and the memory strings ST selectively.

The memory cells C0 to C7 of the first vertical memory strings SST and C0 to C7 and the memory cells C8 to C15 of the second vertical memory strings C8 to C15 and DST vertically connected in the memory block 110_m may be controlled by operating voltages applied to the stacked word lines WL0 to WL7 and the stacked word lines WL8 to WL15, respectively. The word lines WL0 to WL15 may be divided in units of memory blocks.

The select lines DSL and SSL and the word lines WL0 to WL15 may be local lines of the memory block 110_m. In particular, the source select line SSL and the word lines WL0 to WL7 may be local lines of the first vertical memory string. Further, the drain select line DSL and the word lines WL8 to WL15 may be local lines of the second vertical memory string. Pipe gates PG of the pipe transistors PT in the memory block 110_m may be commonly electrically coupled.

Referring to FIGS. 1 and 2B again, the operation circuits 20 to 40 may be configured to perform a program loop, an erase loop, and a read operation of the memory cells C0 electrically coupled to a selected word line (for example, WL0). The program loop may include a program operation and a verifying operation. In addition, the erase loop may include an erase operation and a verifying operation. The operation circuits 20 to 40 may perform the program operation (or a post program operation) for controlling an erase level in which threshold voltages of the memory cells distributes after performing the erase loop.

To perform the program loop, the erase loop, and the read operation, the operation circuits 20 to 40 may selectively output the operating voltages to the local lines SSL, WL0 to WLn, PG, and DSL and the common source line SL of a selected memory block, and may be configured to control a precharge/discharge operation of the bit lines BL or sense a current flow (or a voltage change).

In the case of an NAND flash memory device, the operation circuits may each include a control circuit 20, a voltage supply circuit 30, and a read/write circuit 40. Each component will be described below in detail.

The control circuit 20 may control the voltage supply circuit 30 so that operating voltages for performing the program loop, the erase loop, and the read operation are generated to have target levels in response to a command signal input from the outside. In addition, the operating voltages are applied to the local lines SSL, WL0 to WLn, PG, and DSL, and the common source line SL of the selected memory block. Further, the control circuit 20 may control the read/write circuit 40 to control the precharge/discharge operation of the bit lines BL according to data stored in the memory cells to perform the program loop, the erase loop, and the read operation, or sense the current flow (or the voltage change) of the bit lines BL in the read operation or the verifying operation.

The voltage supply circuit 30 may generate the operating voltages needed according to the program loop, the erase loop, or the read operation of the memory cells according to control of the control circuit 20. In this instance, the operating voltages may include a program voltage, a read voltage, an erase voltage, a pass voltage, a select voltage, a common source voltage, etc. Further, the operating voltages may be applied to the local lines SSL, WL0 to WLn, PG, and DSL, and the common source line SL of the selected memory block in response to a row address signal of the control circuit 20.

The read/write circuit 40 may include a plurality of page buffers electrically coupled to the memory array 10 through the bit lines BL. More specifically, the page buffers may be electrically coupled to the bit lines BL, respectively. Moreover, one page buffer may be electrically coupled to one bit line. In the program operation, the page buffers may selectively precharge the bit lines BL according to a control signal of the control circuit 20 and data stored in the memory cells. In the program verifying operation or the read operation, the page buffers may sense a voltage or current change and latch data read from the memory cells after precharging the bit lines BL according to the control of the control circuit 20.

Figure 3:
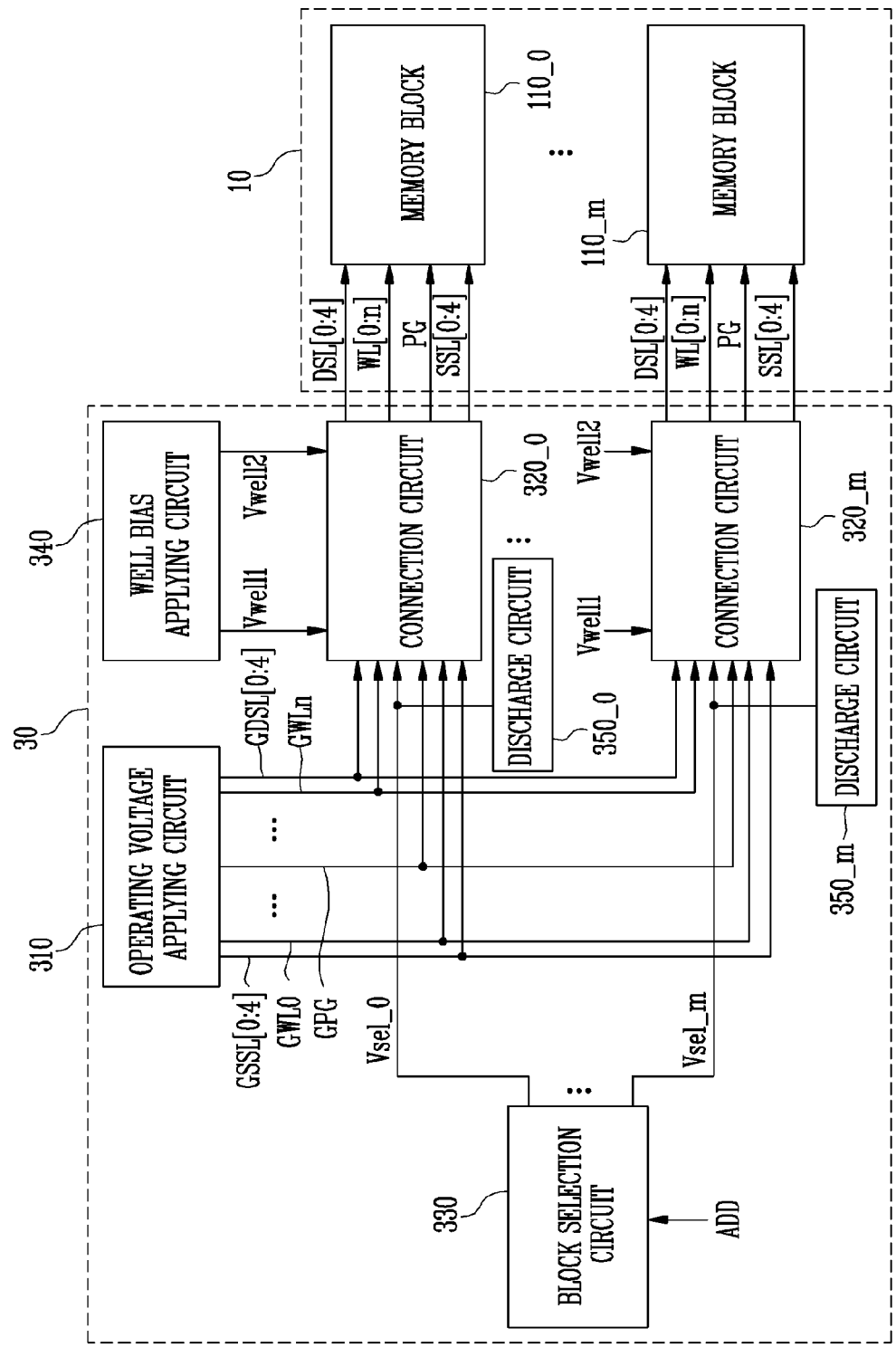
FIG. 3 is a block diagram for describing a power supply circuit of FIG. 1.

Referring to FIG. 3 a block diagram for describing a power supply circuit of FIG. 1 is shown. In addition, referring to FIG. 4, a circuit diagram for describing a power supply circuit of FIG. 1 is also described.

Figure 4:
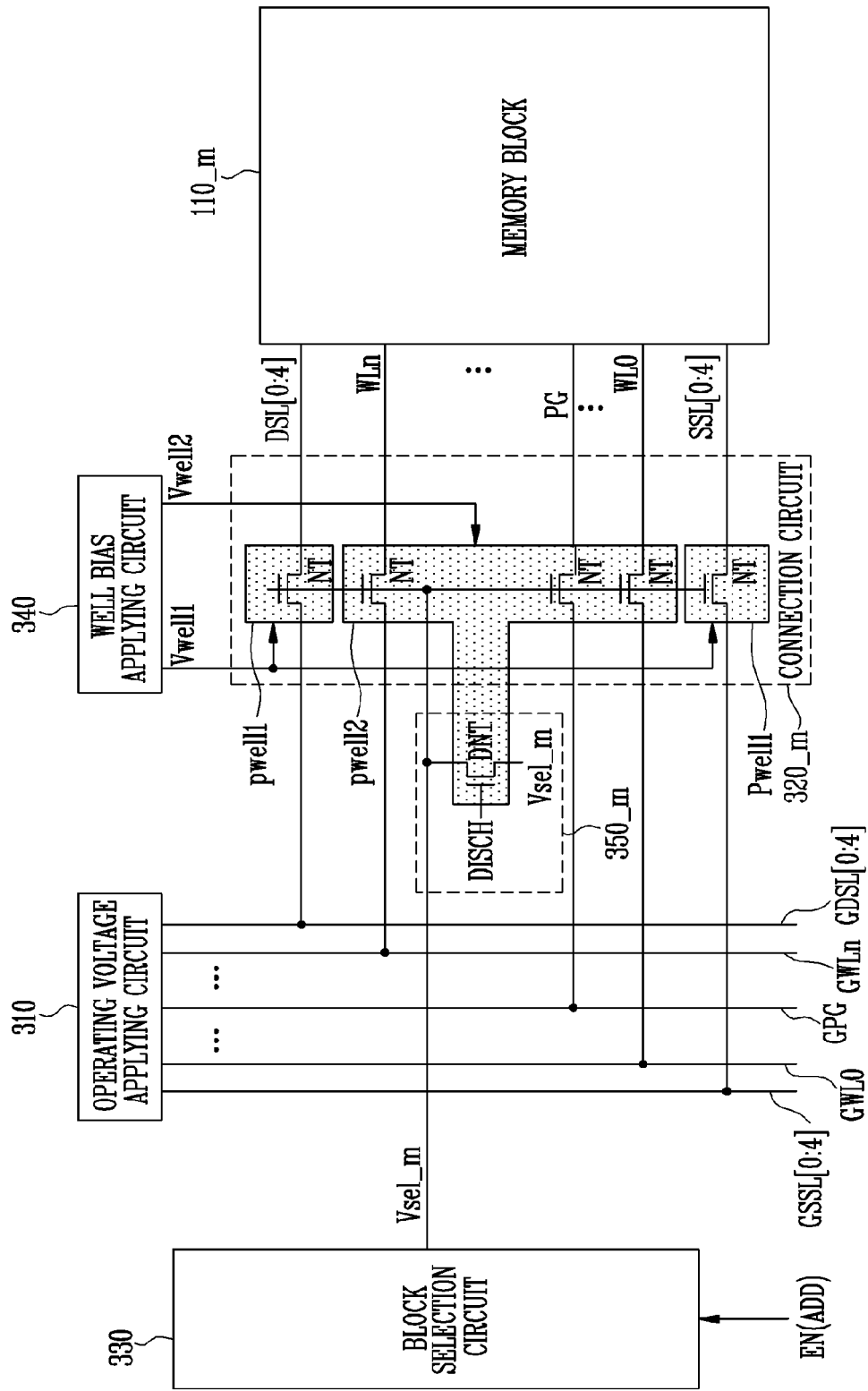
FIG. 4 is a circuit diagram for describing a power supply circuit of FIG. 1.

In FIGS. 3 and 4, the power supply circuit of a semiconductor device may include an operating voltage applying circuit 310, connection circuits 320_0 to 320_m, a block selection circuit 330, and a well bias applying circuit 340. The semiconductor device may further include discharge circuits 350_0 to 350_m. The memory blocks 110_0 to 110-m of the semiconductor device may be the memory blocks described in FIGS. 2A to 2C. The memory blocks 110-0 to 110-m may be configured to include select transistors ST electrically coupled to local select lines SSL and memory cells electrically coupled to local word lines WL.

The operating voltage applying circuit 310 may be configured to output an operating voltage to an output terminal (or the connection circuits 320_0 to 320_m). For example, the operating voltage applying circuit 310 may output the operating voltages needed for the program operation, the read operation, and the erase operation of the memory cells, and the erase operation to global lines GSSL[0:4], GWL0 to GWLn, GPG, and GDSL[0:4]. The operating voltage applying circuit 310 may output a program voltage Vpgm and a pass voltage Vpass to the global lines GWL0 to GWLn for the program operation of the memory cells.

More specifically, as in the following Table 1, the operating voltage applying circuit 310 may be configured to decrease voltages of non-selected global drain select lines to a ground voltage (for example, 0V), or a negative potential level (for example, VNEG_SG) after increasing voltages of the global select lines GDSL[0:4] to a first level (for example, 4.5V). A positive voltage (for example, 2.3V) greater than a threshold voltage of the drain select transistor may be applied to the selected global drain select lines.

TABLE 1

|  |  | New Pgm 1 | | New pgm 2 | | New pgm 3 | |
| --- | --- | --- | --- | --- | --- | --- | --- |
|  |  | Selected | Unselected | Selected | Unselected | Selected | Unselected |
| Block Vsel_0, Vsel_m |  | VPEPMP | 0 V | VPEPMP | 0 V | VPEPMP | Vcc |
| GWL |  | Vpgm or Vpass | Vpgm or Vpass | Vpgm or Vpass | Vpgm or Vpass | Vpgm or Vpass | Vpgm or Vpass |
| GDSL | Selected | VCCI (2.3 V) | VCCI (2.3 V) | VCCI (2.3 V) | VCCI (2.3 V) | VCCI (2.3 V) | VCCI (2.3 V) |
|  | Unselected | VNEG_SG | VNEG_SG | 0 V | 0 V | VNEG_SG | VNEG_SG |
| GSSL | Selected | 0 V | 0 V | 0 V | 0 V | 0 V | 0 V |
|  | Unselected | 0 V | 0 V | 0 V | 0 V | 0 V | 0 V |
| GPG |  | Vpass | Vpass | Vpass | Vpass | Vpass | Vpass |
| SL |  | VCCI (2.3 V) | | VCCI (2.3 V) | | VCCI (2.3 V) | |
| Vwell1 @ STR |  | VNEG | | VNEG | | VNEG | |
| Vwell2 @ WTR |  | 0 V | | Vcc | | Vcc | |

The connection circuits 320_0 to 320_m may be electrically coupled between the global lines GSSL[0:4], GWL0 to GWLn, and GDSL[0:4] and the local lines SSL[0:4], WL0 to WLn, PG, and DSL[0:4] of the memory blocks 110_0 to 110_m, respectively, and operate in response to block selection signals Vsel_0 to Vsel_m, respectively, of the block selection circuit 330. More specifically, the connection circuits 320_0 to 320_m may perform an operation of selectively electrically coupling the global lines GSSL[0:4], GWL0 to GWLn, PGP, and GDSL[0:4] and the local lines SSL[0:4], WL0 to WLn, PG, and DSL[0:4] of the selected memory block 110_m in response to the block selection signals Vsel_0 to Vsel_m of the block selection circuit 330 so that the operating voltages (for example, the program voltage, the erase voltage, the read voltage, the pass voltage, the pipe gate voltage, the verifying voltage, etc.) output from the operating voltage applying circuit 310 to the global lines GSSL[0:4], GWL0 to GWLn, GPG, and GDSL[0:4] are transferred to the local lines SSL[0:4], WL0 to WLn, PG, and DSL[0:4] of the selected memory block 110_m.

The connection circuits 320_0 to 320-m may include transistors NT electrically coupled between the global lines GSSL[0:4], GWL0 to GWLn, GPG, and GDSL[0:4] and the local lines SSL[0:4], WL0 to WLn, PG, and DSL[0:4] of the memory block, respectively. The operating voltages having a high level may be applied to drains of the transistors NT. Further, one decision signal among block selection signals Vsel_0 to Vsel_m of the block selection circuit 330 may be applied to the gates of the transistors NT.

In the flash memory device, the connection circuits 320_0 to 320_M may be electrically coupled to the memory blocks 110_0 to 110_m, respectively. In addition, the connection circuits 320_0 to 320_m may selectively operate in response to block selection signals Vsel_0 to Vsel_m of the block selection circuit 330. For example, only one connection circuit selected by the block selection signals Vsel_0 to Vsel_m of the block selection circuit 330 among the connection circuits 320_0 to 320_m may be selectively operated.

In particular, the connection circuit 320_m may include a first connection circuit and a second connection circuit. The first connection circuit may include NMOS transistors NT configured to electrically couple the local select lines DSL [0:4] and SSL[0:4] of the selected memory block 110_m to the global select lines GDSL[0:4] and GSSL[0:4] in response to the block selection signal Vsel_m. The first connection circuit may include transistors (for convenience, only one transistor is shown) electrically coupled to the global select line GDSL[0:4] and GSSL[0:4], respectively. The first connection circuit may be formed in a first well region Pwell1 of the substrate SUB. The second connection circuit may include NMOS transistors NT configured to electrically couple the local word lines WL[0:n] of the selected memory block 110_m to the global word lines GWL[0:n] in response to the block selection signal Vsel_m. The second connection circuit may be formed in a second well region Pwell1. The first well region Pwell1 may be isolated from the second well region Pwell1.

The first connection circuit may be formed in the first well region Pwell1 of the substrate SUB in order to electrically couple the local select lines DSL[0:4] and SSL[0:4] of the selected memory block 110_0 to the global select lines GDSL[0:4] and GSSL[0:4]. The second connection circuit may be formed in the second well region Pwell1 of the substrate SUB to electrically couple the local word lines WL[0:n] of the selected memory block 110_0 to the global word lines GWL[0:n].

The first well region Pwell1 may be formed on both sides of the second well region Pwell1, respectively. More specifically, the first well region Pwell1 of the first connection circuit for electrically coupling the global drain select lines GDSL[0:4] and the local drain select lines DSL[0:4] may be formed on one side of the second well region Pwell2. Further, the first well region Pwell1 of the first connection circuit for electrically coupling the global source select lines GSSL[0:4] and the local source select lines SSL[0:4] may be formed on the other side of the second well region Pwell2.

The first well region Pwell1 may include a P well, and the second well region Pwell2 may include a P well. The first well region Pwell1 may be isolated from the second well region Pwell2. The P well of the first well region Pwell1 and the P well of the second well region Pwell2 may be formed in the same N well (Nwell of FIG. 5A). Further, the N well (Nwell of FIG. 5A) of the first well region Pwell1 may be isolated from the N well (Nwell of FIG. 5B) of the second well region Pwell2. Further, the N well of the first well region Pwell1 may be electrically coupled to the N well of the second well region Pwell2.

The block selection circuit 330 may output block selection signals Vsel_0 to Vsel_m to the connection circuits 320_0 to 320_m in response to an address signal ADD. One signal among the block selection signals Vsel_0 to Vsel_m may be activated, and the remaining signals may be deactivated. The connection circuit 320_0 in which the block selection signal Vsel_0 is input may transfer the operating voltages output to the global lines GSSL[0:4], GWL0 to GWLn, GPG, and GDSL[0:4] to the selected memory block 110_0 without a voltage drop. The connection circuits 320-m in which the deactivated block selection signals Vsel_m are input may block to transfer the operating voltages output to the global lines GSSL[0:4], GWL0 to GWLn, GPG, and GDSL[0:4] to the selected memory block 110_0.

In particular, when a first memory block 110_0 is selected in response to the address signal ADD, the block selection signal Vsel_0 among the block selection signals Vsel_0 to Vsel_m output from the block selection circuit 330 may be activated, and the remaining signals Vsel_m may be deactivated. Further, only the connection circuit 320_0 to which the block selection signal Vsel_0 is applied may normally operate. Further, the remaining connection circuits 320_m to which the block selection signal Vsel_m is applied may not operate. Accordingly, the operating voltages of the global lines GSSL[0:4], GWL0 to GWLn, GPG, and GDSL[0:4] may be normally transferred to only the local lines SSL[0:4], WL0 to WLn, DSL[0:4] of the selected memory block 110_0 without a voltage drop through the connection circuit 320_0.

The block selection circuit 330 may output a block selection signal Vsel_0 having a higher level than the operating voltage to the connection circuit 320_0 so that the operating voltage transferred to the local lines SSL[0:4], and WL0 to WLn, DSL[0:4] of the selected memory block 110_0 maintains the same level as the operating voltages of the global lines GSSL[0:4], GWL0 to GWLn, and GDSL [0:4] without voltage drop. For example, the block selection circuit 330 may output the block selection signal Vsel_0 having a higher voltage VPEPMP as much as a threshold voltage of the transistor NT than the operation voltage so that the operating voltage transfers to the selected memory block 110_0 in a period when the operating voltage applying circuit 310 outputs the operating voltage (for example, the program voltage) to the global lines GSSL[0:4], GWL0 to GWLn, and GDSL[0:4].

More specifically, the block selection circuit 330 may be configured so that different positive potentials are output as the block selection signal Vsel_0 of the selected memory block 110_0 and the block selection signals Vsel_m of the non-selected memory blocks 110_m, respectively. In particular, the block selection circuit 330 may output the block selection signals Vsel_m having a power supply voltage Vcc of a lower level than the voltage VPEPMP of the block selection signal Vsel_0. Further, the block selection signal Vsel_0 is output to have a higher level than the block selection signals Vsel_m of the non-selected memory blocks 110_m. Since the connection circuit 320_m transfers the voltage having a lower level as much as the threshold voltage of the transistor NT than the power supply voltage Vcc to the local lines SSL[0:4], WL0 to WLn, PG, and DSL[0:4] of the non-selected memory block 110_m, the transferred voltage may not have an influence on data stored in the memory cells of the non-selected memory block 110_m.

The well bias applying circuit 340 may be configured to apply a first well bias Vwell1 to the first well region Pwell1, and apply a second well bias Vwell2 to the second well region Pwell1. The well bias applying circuit 340 may be configured to apply the first well bias Vwell1 of a negative potential VNEG to the first well region Pwell1. The well bias applying circuit 340 may also apply the second well bias Vwell2 of a ground voltage (for example, 0V) or positive potential (for example, Vcc) to the second well region Pwell1, in an operation (particularly, the program operation) of the memory cells.

The discharge circuit 350_m may be configured to discharge a line of transferring the block selection signal Vsel_m to the NMOS transistors NT of the first and second connection circuits 320_0 to 320-m in response to a discharge signal DISCH. The discharge circuit 350_m may be formed in a third well region. Further, the third well region may be electrically coupled to the second well region Pwell1. More specifically, the discharge circuit 350_m may be formed in the same second well region Pwell1 as the second connection circuit 320-m. The discharge circuit 350_m may be electrically coupled between the line transferring the block selection signal Vsel_m and a discharge node, and include an NMOS transistor DNT operating in response to the discharge signal DISCH. The NMOS transistor DNT may be electrically coupled between the line transferring the block selection signal Vsel_m and the discharge node. The discharge signal DISCH may be generated by a negative potential level shifter, which operates in response to the negative voltage VNEG and an enable signal.

TABLE 2

|  | New Disch. 1 | | New Disch. 2 | | New Disch. 3 | |
| --- | --- | --- | --- | --- | --- | --- |
| Block | Sel. | Unsel. | Sel. | Unsel. | Sel. | Unsel. |
| DISCH | <Vt | >Vt | <Vt | >Vcc + Vt | <Vcc + Vt | >Vcc + Vt |
| VNEG_WL | | 0 V | | Vcc | | Vcc |

As shown in Table 2 above, the discharge signal DISCH having a lower level than a voltage obtained by adding a threshold voltage Vt of the transistor DNT and the power supply voltage Vcc or the threshold voltage Vt may be applied to the discharge circuit 350_0 of the selected memory block 110_0. The discharge signal DISCH having a higher level than the threshold voltage Vt of the transistor DNT or a voltage obtained by adding the threshold voltage Vt and the power supply voltage Vcc may be applied to the discharge circuit 350_m of the non-selected memory block 110_m. The ground voltage (for example, 0V) or the positive voltage (for example, Vcc) may be applied to the discharge nodes of the discharge circuits 350_0 to 350_m.

Figure 5A:
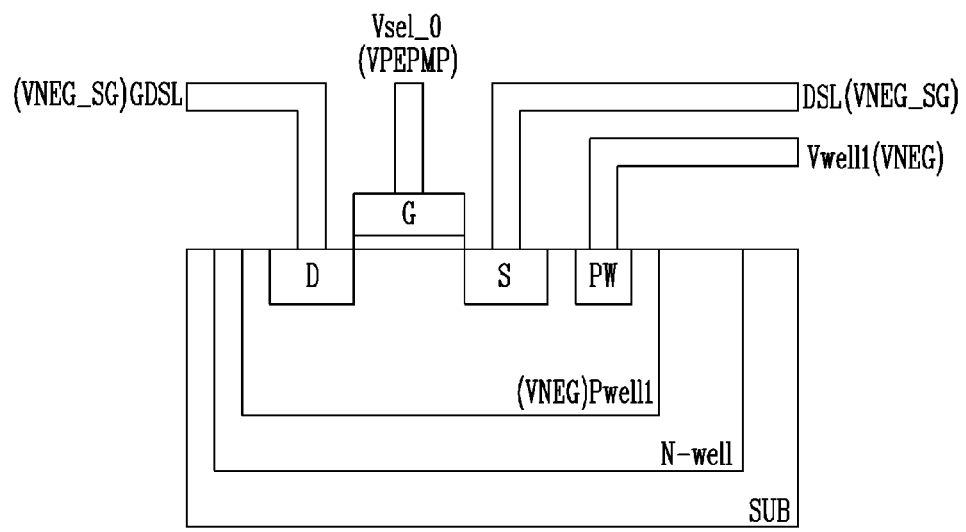
FIGS. 5A and 5B are diagrams for describing an operation of a semiconductor device according to an embodiment of the invention.
Figure 5B:
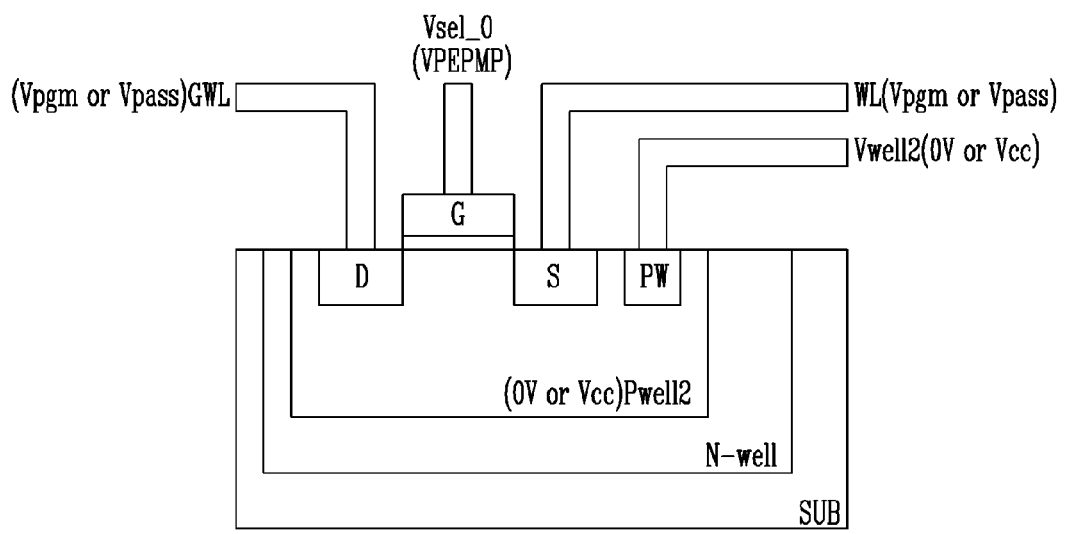

Hereinafter, an operation of the semiconductor device including the components described above will be described. Referring to FIGS. 5A and 5B, diagrams for describing an operation of a semiconductor device according to an embodiment of the invention are illustrated.

Referring to Table 1, and FIGS. 5A and 5B, the block selection signal Vsel_0 having a higher voltage VPEPMP than the program voltage may be applied to the connection circuit of the selected memory block for the program operation. Further, the block selection signal Vsel_m having the ground voltage (for example, 0V) or the power supply voltage Vcc may be applied to the connection circuit of the non-selected memory block. As a result, the operating voltages applied to the global lines GSSL, GWL0 to GWLn, GPG, and GDSL may be transferred to the local lines of the selected memory block.

The program voltage Vpgm and the pass voltage Vpass may be selectively applied to the global word lines GWL. More specifically, the program voltage Vpgm may be applied to the selected global word line. In addition, the pass voltage Vpass may be applied to the non-selected global word line. The ground voltage (for example, 0V) may be applied to the global source select line GSSL. The pass voltage Vpass may be applied to the global pipe gate line PGP. Further, a positive voltage (for example, 2.3V) may be applied to the common source line SL. The first well bias Vwell1 of the negative potential VNEG may be applied to the first well region of the connection circuit coupling the global select lines GDSL and GSSL and the local select lines of the memory block in response to the block selection signals Vsel_0 to Vsel_m. In addition, the second well bias Vwell2 having the ground voltage 0V or the power supply voltage Vcc may be applied to the second well region of the connection circuit coupling the global word lines GWL and the local word lines of the memory block.

The plurality of memory strings may be electrically coupled to each bit line in the memory block. One memory string among the memory strings electrically coupled to the bit line in the selected memory block may be selected and the remaining strings may not be selected in the program operation for storing data. Accordingly, different voltages may be applied to the local drain select line of the selected memory string, and the local drain select lines of the non-selected memory strings. For this, the different voltages may be applied to the selected global select line, and the non-selected global select lines, respectively.

First, a high voltage of a first level (for example, 4.5V) may be applied to every global select lines GDSL in a period when the voltages of the bit lines are set up according to data to be stored the memory cells. Next, a voltage of the local drain select line of the selected memory string may be decreased to a second level (for example, 2.3V).

A voltage of the local drain select lines of the non-selected memory strings may be decreased to the ground voltage (for example, 0V). However, when a leakage current is generated in the non-selected memory strings, a voltage in the vertical channel may be changed. In addition, a threshold voltage of the memory cell may be changed. Accordingly, the negative voltage VNEG_SG may be applied to the local drain select lines of the non-selected memory strings to suppress the generation of the leakage current. For this reason, the negative voltage VNEG_SG may be applied to the non-selected global drain select lines.

The negative voltage VNEG_SG of the non-selected global drain select line may be applied to the drain (D of FIG. 5A) of the NMOS transistors NT included in the connection circuit. When the first well region Pwell1 in which the first connection circuit is formed is electrically coupled to the second well region Pwell2 in which the second connection circuit is formed, since a voltage difference between the drain to which the negative voltage VNEG_SG is applied and the wells Pwell1 and Pwell2 is increased, breakdown characteristics may be deteriorated.

However, the breakdown characteristics may be improved by isolating the first well region Pwell1 in which the transistor of the first connection circuit is formed from the second well region Pwell2 in which the transistor of the second connection circuit is formed, and applying different well biases Vwell1 and Vwell1.

More specifically, like a first program method (New Pgm 1), since the first well bias Vwell1 of the negative potential VNEG is applied to the first well region Pwell1 and the ground voltage 0V is applied to the second well region Pwell2, the breakdown characteristics of the transistors included in the connection circuit may be prevented from deteriorating. Further, like a first discharge method (New Disch. 1) of Table 2, since the ground voltage 0V is also applied to the well region Pwell2 of the discharge circuit (350_m of FIG. 4), the breakdown characteristics of the transistor included in the discharge circuit may be prevented from deteriorating accordingly.

Similar to a second program method (New Pgm 2), when the second well bias Vwell2 of a positive potential (for example, Vcc) is applied to the second well region Pwell2, since a voltage difference between the drain (D of FIG. 5B) and the well Pwell2 is reduced, the breakdown characteristics can be improved. Further, like a third program method (New Pgm 3), when the second well bias Vwell2 of the positive potential (for example, Vcc) is applied to the second well region Pwell2 and the block selection signal Vsel_m of the positive potential (for example, Vcc) is applied to the connection circuit of the non-selected memory block, the breakdown characteristics of the transistors included in the connection circuit of the non-selected memory block may be improved as a result.

Further, like a second discharge method (New Disch. 2) of Table 2, the breakdown characteristics of the transistor (DNT of FIG. 4) may also be improved by applying a voltage NVEG_WL of the positive potential Vcc to the well region of the transistor (DNT of FIG. 4) included in the discharge circuit and the discharge node. Moreover, like the third discharge method (New Disch. 3) of Table 2, when a voltage condition of the discharge signal DISCH is changed, the breakdown characteristics of the transistor (DNT of FIG. 4) may be further improved accordingly.

Figure 6:
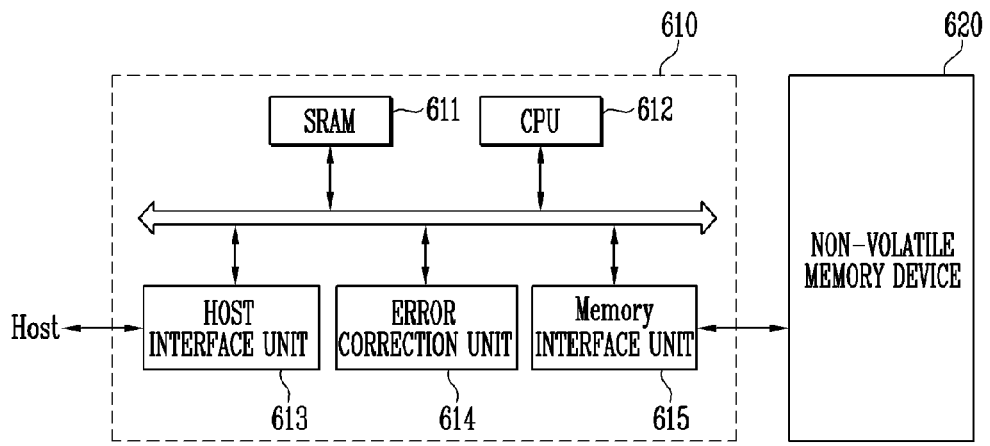
FIG. 6 is a block diagram schematically illustrating a memory system according to an embodiment of the invention.

Referring to FIG. 6, a block diagram schematically illustrating a memory system according to an embodiment of the invention is shown.

In FIG. 6, a memory system 600 according to an embodiment of the invention may include a non-volatile memory device 620, and a memory controller 610.

The non-volatile memory device 620 may be the semiconductor device described in FIG. 1. In addition, the memory block and the operation circuits may be electrically coupled as described in FIGS. 3 and 4. The memory controller 610 may be configured to control the non-volatile memory device 620. The memory system 600 may be provided as a memory card or a solid state disk (SSD) formed by combining the non-volatile memory device 620 and the memory controller 610. A static random access memory (SRAM) 611 may be used as an operation memory of the memory system 600. A host interface unit 613 may include a data exchange protocol of a host electrically coupled to the memory system 600. An error correction unit 614 may detect and correct an error included in data read from a cell region of the non-volatile memory device 620. The memory interface unit 615 may interface with the non-volatile memory device 620 of the invention. A processing unit (CPU) 612 may perform various control operations for data exchange of the memory controller 610.

It is apparent to those of ordinary skill in the art that the memory system 600 according to an embodiment of the invention may further include a read only memory (ROM) (not shown) for storing code data for an interface with the host. The non-volatile memory device 620 may be provided as a multi-chip package configured by a plurality of flash memory chips. The memory system 600 according to an embodiment of the invention may be provided as a high reliability storage media having improved operating characteristics. More specifically, the flash memory device of the invention may be included in the memory system such as the SSD, which is recently and actively being studied. In this case, the memory controller 610 may communicate with the outside (for example, the host) through one among various interface protocols such as a Universal Serial Bus (USB) protocol, a MultiMediaCard (MMC) protocol, a Peripheral Component Interconnect-Express (PCI-E) protocol, a Serial-Advanced Technology Attachment (SATA) protocol, a Parallel-ATA (PATA) protocol, a Small Computer System Interface (SCSI) protocol, an Enhanced Small Disk Interface (ESDI) protocol, an Integrated Drive Electronics (IDE) protocol, etc.

Figure 7:
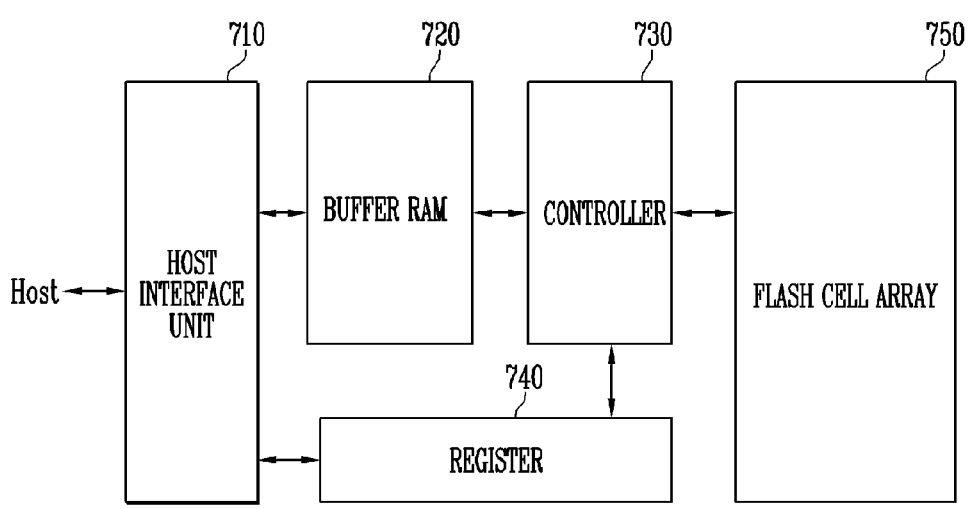
FIG. 7 is a block diagram schematically illustrating a fusion memory device or a fusion memory system performing a program operation according to various embodiments described above.

Referring to FIG. 7, a block diagram schematically illustrating a fusion memory device or a fusion memory system performing a program operation according to various embodiments described above is shown. For example, technical features may be applied to one NAND flash memory device 700 as a fusion memory device.

The one NAND memory device 700 may include a host interface unit 710 for exchanging various information with a device using a different protocol, a buffer RAM 720 for embedding codes for driving the memory device, or for temporarily storing data, a controller 730 for controlling every operation such as a read operation, a program operation, etc. in response to a control signal and a command, a register 740 for storing data such as setting, e.g., a configuration, etc defining a system operating environment inside the memory system, and a flash cell array 750 configured as an operation circuit including a non-volatile memory cell and a page buffer. The one NAND memory device may program data according to a method in response to a write request from the host.

Figure 8:
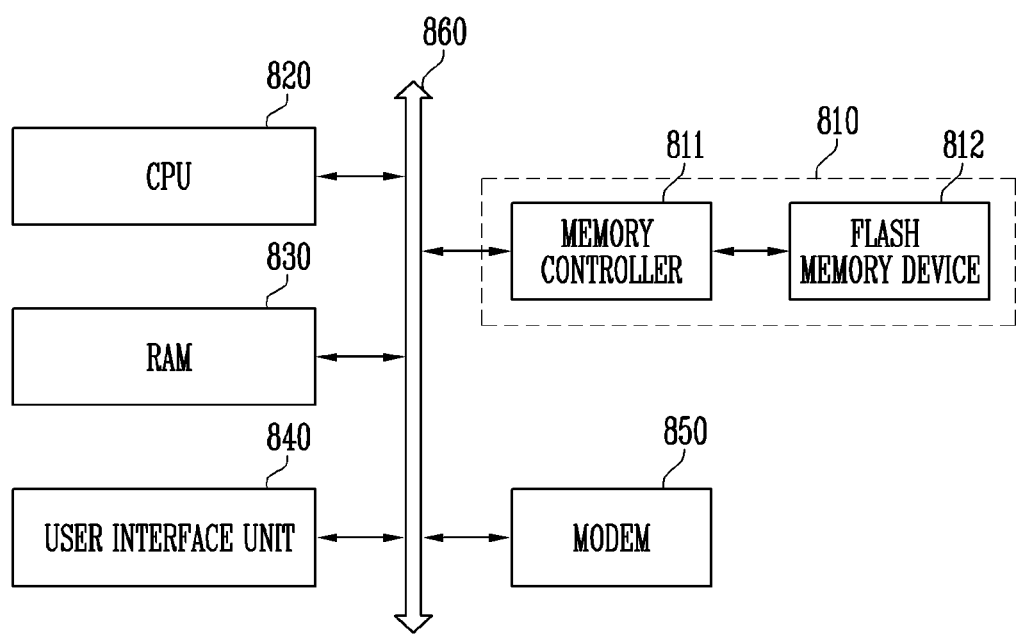
FIG. 8 is a block diagram schematically illustrating a computing system including a flash memory device according to an embodiment of the invention.

Referring to FIG. 8, a block diagram schematically illustrating a computing system including a flash memory device 812 and memory controller 811 according to an embodiment of the invention is shown.

A computing system 800 according to the invention may include a microprocessor (CPU) 820, a RAM 830, a user interface unit 840, a modem 850 such as a baseband chipset, and a memory system 810 electrically coupled to a system bus 860. When the computing system 800 according to the invention is a mobile device, the computing system 800 may further include a battery for supplying an operating voltage of the computing system 800. Although not shown, it is apparent to those of ordinary skill in the art that the computing system 800 according to the invention may further include an application chip set, a camera image processor (CIS), a mobile DRAM device, etc. For example, the memory system 810 may be the SSD using the non-volatile memory described in FIG. 1 for storing data. The memory system 810 may be provided as a fusion flash memory (for example, the one NAND flash memory).

The semiconductor device according to an embodiment of the invention can improve the operating characteristics.

In the figures and specification, there have been disclosed typical embodiments of the invention and, although specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made without departing from the spirit and scope of the invention as defined by the following claims.

What is claimed is:

1. A semiconductor device, comprising:
   memory blocks including select transistors electrically coupled to local select lines and memory cells electrically coupled to local word lines;
   a first connection circuit configured to electrically couple the local select lines of a selected memory block and global select lines according to a block select signal, and formed in a first well region of a substrate; and
   a second connection circuit configured to electrically couple the local word lines of the selected memory block and global word lines according to the block selection signal, and formed in a second well region of the substrate,
   wherein the first well region is isolated from the second well region, and the first connection circuit and the second connection circuit comprise NMOS transistors,
   each of the first well region and the second well region comprises a P well, and
   the P well of the first well region and the P well of the second well region are formed in a same N well.

2. The semiconductor device of claim 1, wherein a first well bias is applied to the first well region and a second well bias is applied to the second well region.

3. The semiconductor device of claim 2, wherein the well bias applying circuit is configured to apply the first well bias of a negative potential to the first well region, and apply the second well bias of a ground voltage or the second well bias of a positive potential to the second well region.

4. The semiconductor device of claim 1, further comprising:
   a block selection circuit configured to output a block selection signal to the first and second connection circuits according to an address signal.

5. The semiconductor device of claim 4, wherein the block selection circuit is configured to allow the block selection signal of the selected memory block and block selection signals of non-selected memory blocks that are output to have different positive potentials.

6. The semiconductor device of claim 5, wherein the block selection signal of the selected memory block is output with a higher level than the block selection signals of the non-selected memory blocks.

7. The semiconductor device of claim 1, further comprising:
   an operating voltage applying circuit configured to apply operating voltages to operate the memory cells to the global select lines and the global word lines.

8. The semiconductor device of claim 7, wherein the operating voltage applying circuit is configured to decrease voltages of non-selected global drain select lines to a ground voltage or a negative potential level after increasing voltages of the global select lines to a first level.

9. The semiconductor device of claim 1, further comprising:
   a discharge circuit configured to discharge a line transferring the block selection signal to the first and second connection circuits in response to a discharge signal, and installed in a third well region,
   wherein the third well region is electrically coupled to the second well region.

10. The semiconductor device of claim 9, wherein the discharge circuit comprises an NMOS transistor electrically coupled between the line and a discharge node, and configured to operate according to the discharge signal.

11. A semiconductor device, comprising:
    a first connection circuit formed in a first well region of a substrate to electrically couple local select lines of a selected memory block and global select lines; and
    a second connection circuit formed in a second well region of the substrate to electrically couple local word lines of the selected memory block and global word lines,
    wherein the first well region is isolated from the second well region, and the first connection circuit and the second connection circuit comprise NMOS transistors,
    the first well region comprises a first P well formed in a first N well of the substrate, and the second well region comprises a second P well formed in a second N well of the substrate, and
    the first N well and the second N well are electrically coupled to each other.

12. The semiconductor device of claim 11, wherein the first connection circuit comprises first transistors configured to electrically couple the local select lines and the global select lines in response to a block selection signal, and
    the second connection circuit comprises second transistors configured to electrically couple the local select lines and the global word lines in response to the block selection signal.

13. The semiconductor device of claim 11, wherein the first well region is configured to be formed on both sides of the second well region.

14. A semiconductor device, comprising:
    a first connection circuit configured with first transistors to electrically couple select lines of a memory block to global select lines according to a block selection signal in a first well region; and
    a second connection circuit configured with second transistors to electrically couple local word lines of the memory block to global word lines according to the block selection signal in a second well region,
    wherein a first well bias having a negative potential is applied to the first well region, and a second well bias having a ground voltage or a positive potential is applied to the second well region.

* * * * *